Oct. 24, 1967 J. C. ECKHARDT ETAL 3,349,162

INTRA-CONNECTION TECHNIQUES FOR MULTILAYER PRINTED WIRING BOARDS

Filed Aug. 23, 1965 3 Sheets-Sheet 1

INVENTOR
JOHN C. ECKHARDT
WILLIAM L. YESSA
BY
ATTY.

INVENTOR
JOHN C ECKHARDT
WILLIAM L. YESSA
BY
ATTY.

INVENTOR
JOHN C. ECKHARDT
WILLIAM L. YESSA
BY C. A. Gullbrandsen
ATTY.

United States Patent Office 3,349,162
Patented Oct. 24, 1967

3,349,162

INTRA-CONNECTION TECHNIQUES FOR MULTILAYER PRINTED WIRING BOARDS

John C. Eckhardt, Roselle, and William L. Yessa, Lemont, Ill., assignors to Automatic Electric Laboratories, Inc., Northlake, Ill., a corporation of Delaware Filed Aug. 23, 1965, Ser. No. 481,742
4 Claims. (Cl. 174—68.5)

ABSTRACT OF THE DISCLOSURE

A multilayer circuit board interconnection technique provides a plurality of strips of conductive material on the walls of each of a plurality of apertures formed in the board. The ends of conductors printed on the several layers of the board are exposed in the aperture and each strip in an aperture serves to interconnect certain conductors. The strips may interconnect conductors on adjacent as well as non-adjacent layers. The strips are plated on the aperture walls by a process which includes the use of collimated light and a photographic mask to expose the photosensitized board surfaces and aperture walls to sharply defined bands of light.

This invention relates to multilayer circuits and methods for their manufacture. More particularly, this invention relates to a technique for providing electrical interconnections of the printed conductors existing on various layers of a multilayer printed circuit board.

The plated-through hole technique has been established as a reliable method for interconnecting the circuitry existing on laminated layers of printed circuit boards. With the plated-through hole method, electrical paths on separate levels are interconnected and brought out to the surface with a plating on the insides of the hole. However, each plated-through connection requires a separate hole to be drilled in the board, and the interconnecting holes limit the packaging density obtainable with multilayer wiring.

It is the object of this invention to provide a new and improved multilayer printed circuit board.

Another object is to provide a new method for interconnecting conductor configurations existing at various levels of a multilayer printed circuit board.

Another object is to provide increased wiring and component densities for printed circuit boards.

According to the invention, a plurality of conductors are selectively plated on the walls of apertures formed in a multilayer printed circuit board at predetermined positions. Preferably, the technique for selectively plating these conductors includes: applying copper to the surfaces of the board and of the apertures; photosensitizing these surfaces; exposing selected portions of the photosensitized surfaces to light; photographically developing the surfaces; plating the developed surfaces with acid resistive metal; and etching away the undesired portions of copper from the board.

These and other objects and features will become more apparent from the subsequent detailed description which makes reference to the drawings.

Figure 1:
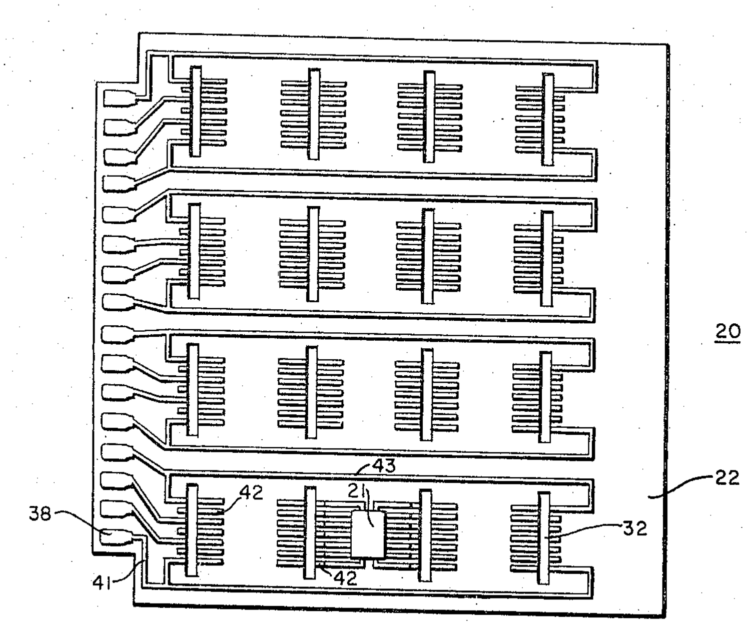
FIG. 1 is a top view, of a composite multilayer board constructed in accordance with the invention.
Figure 2:
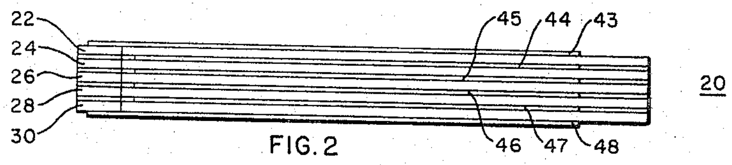
FIG. 2 is a side view of the board shown in FIG. 1.
Figure 3:
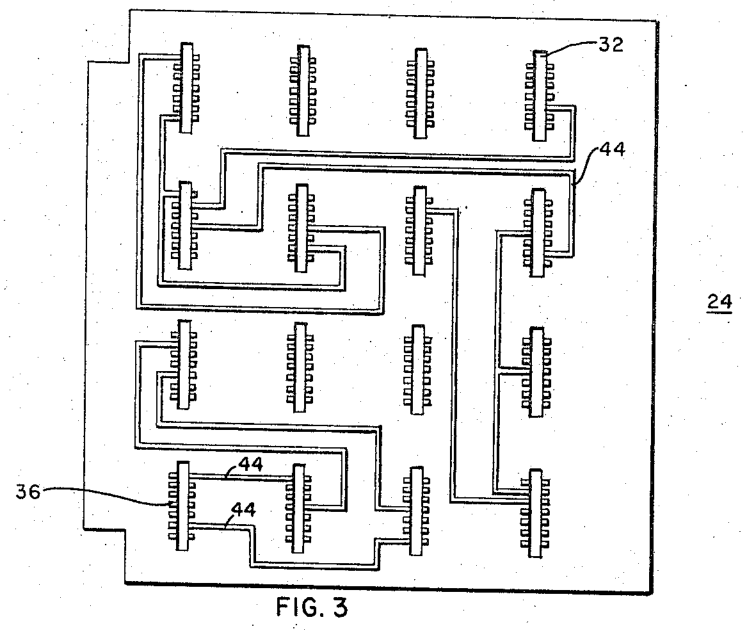
FIG. 3 shows a plan view of one of the internal layers.

A preferred embodiment is shown in FIGS. 1–3. The composite board 20 is seen to consist of a number of 5½" x 6" sheets 22, 24, 26, 28 and 30 of insulating material, such as epoxy glass, which have been laminated together. Prior to lamination, the inner layers 24, 26 and 28 have copper conductors 43, 45, 46 and 47 printed on their surfaces in a predetermined pattern. An example of an inner layer is shown in FIG. 3. Each of these sheets also has a plurality of parallel short conductors 36, hereinafter referred to as tabs, at those positions where the interconnections are to be made. The printed wiring on the inner layers has been arranged so that the ends of each of the printed conductors 44 which are to be interconnected, terminate in a particular tab at a predetermined position on the sheet. A number of inner sheets are stacked together with a top and a bottom sheet, and the sheets are laminated together forming the composite board 20.

Slots 32 are then punched in the laminated board 20 at each of the terminal positions, exposing the ends of the printed conductors on each layer in the walls of the slots via tabs 36. Preferably, the slots are rectangular because their shape will simplify the interconnection technique. In FIG. 1, the slots are shown in a 4 x 4 pattern. However, it should be kept in mind that the arrangement of slots is not limited to this pattern and that more than 16 slots may be used.

In order to interconnect printed conductors existing on the inner layers of the composite board to the conductors existing on the top and bottom layers, a number of conductive strips 42 (FIG. 9) are selectively plated on the walls of each slot and in contact relationship with tabs 36. For instance, conductors 44 on sheet 24, FIG. 3, are connected to conductors 41 and 43 respectively in the top layer by means of two separate copper conductors 63 and 64 which extend from the top layer conductors 41 and 43 into the slot, FIG. 9.

When the conductive strips 42 are being selectively plated in the slots 32, the surface wiring pattern is also established on the surface sheets 22 and 30. In FIG. 1, the surface wiring pattern for the top layer is shown. Conductors 41 and 43 extend across the top surface of the board, having portions terminating at certain of the slots and other portions supplying input connections from other boards and from power supplies via contact tabs 38. Preferably, the composite card has the contact tabs arranged so that the card may be plugged into a standard printed circuit card connector.

Conductors 41 and 43 appear to be identical for each row of slots 32. This is an example of how standard cards may be used for either the top or the bottom layers or for both in order to provide standard inputs and outputs for each card while variations in circuit connections may be restricted to the inner layers. If desired, electrical component elements 21 may be attached to the board and connected to the internal conductors via slot conductors 42, as shown in FIG. 1.

The side view of the composite board 20, FIG. 2, shows how the board is formed of sheets 22, 24, 26, 28 and 30 of insulating material which have conductors 43, 44, 45, 46 and 47 either etched or plated on the surfaces.

The fabrication of this board will now be described in more detail. The desired printed wiring pattern is established on each of the inner sheets using standard print and etch techniques. A negative working resist is used to facilitate the etching process for these layers.

Figure 4:
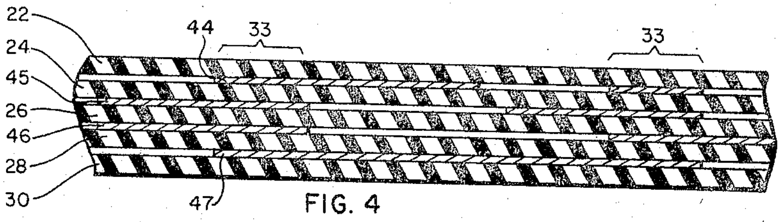
FIG. 4 is a sectional view of a multilayer board.

The printed inner layers are then aligned and stacked together with a standard top sheet and a standard bottom sheet, and a composite board is formed by laminating under heat and pressure to form a 1/16" thick multilayer board. The thickness of the board is, of course, dependent upon the number of layers that are included, but will generally be approximately 1/16" thick. A sectional view of such a board is shown in FIG. 4.

The formation of the composite board up to this point is completed using standard multilayer techniques. However, from this point in the process, certain unique steps are required in order to complete the fabrication of the board.

Referring again to FIG. 4, the laminated board is shown in sectional view. Printed copper conductors 44, 45, 46 and 47 can be seen between the layers of insulating material 22, 24, 26, 28 and 30. The tabs 36 that are to be connected are shown to be vertically aligned within two areas in the composite board designated 33. An aperture having straight walls extending perpendicularly of the upper and lower surfaces of the board will be provided at both of these points.

In order to minimize the breakway of epoxy glass which normally occurs along the periphery of the bottom edge when the rectangular slots are formed, a special "guillotine" punch which has a face angle of approximately 60° from the vertical, is used. The use of this "guillotine" punch permits the slots to be sliced rather than perforated, so that there is less breaking of the bottom edge of the composite card as the face of the punch goes through the board.

Figure 5:
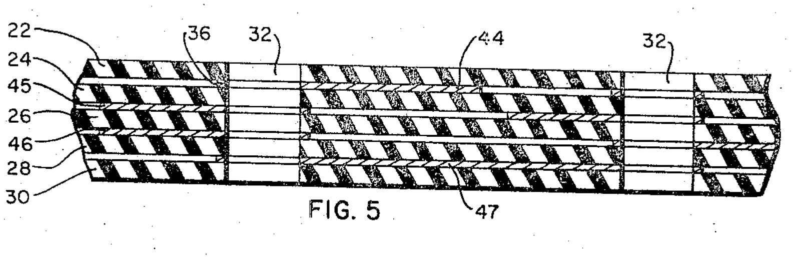
FIG. 5 is similar to FIG. 4 but also shows slots formed in the board.
Figure 6:
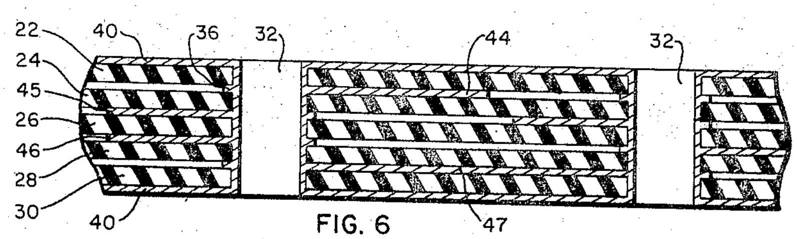
FIG. 6 is similar to FIG. 5 but also shows a conductive coating applied to the sides of the slots and to the top and bottom of the board.

After the slots 32 have been punched, FIG. 5, exposing the ends of the internal copper conductors 44, 45, 46 and 47 in the slots 32 via tabs 36, and the surfaces of the slots 32 have been cleaned, all of the exposed surfaces of the board, including the walls of the slots 32, are copper plated using standard techniques. A cross-sectional view of the board showing the copper plating 40 is shown in FIG. 6. Close control of the current density is required to prevent plating buildup on high-current-density areas such as the edge of the slot. This is accomplished with periodic-reverse-current electroplating. It should be noted that the plating thickness in the hole must be approximately the same as the surface thickness to facilitate etching.

Figure 7:
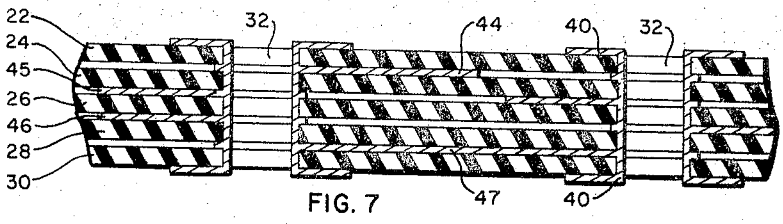
FIG. 7 is similar to FIG. 6 but shows how portions of a conductive material have been etched away to provide a particular conductor pattern.

FIG. 7 shows a cross-sectional view of a portion of a finished board. The undesired portions of the copper have been etched away. The copper plating 40 is seen to interconnect the printed conductors via the walls of the slots. Note that conductors 44, 45, 46 and 47 now appear as integral portions of the conductive strips 40.

The method of establishing the surface wiring pattern and the multiple-conductor wiring pattern on the internal slot walls is one of the distinguishing features of this invention and will now be described in detail. These patterns are established using a technique similar to that shown in "Three-Dimensional Printed Wiring" by E. A. Guditz in Electronics, June 1, 1957, pp. 160–163.

After the composite board has been formed by laminating the layers together, the slots are punched, and the exposed surfaces are plated with copper.

Figures 8, 9, 10, 11:
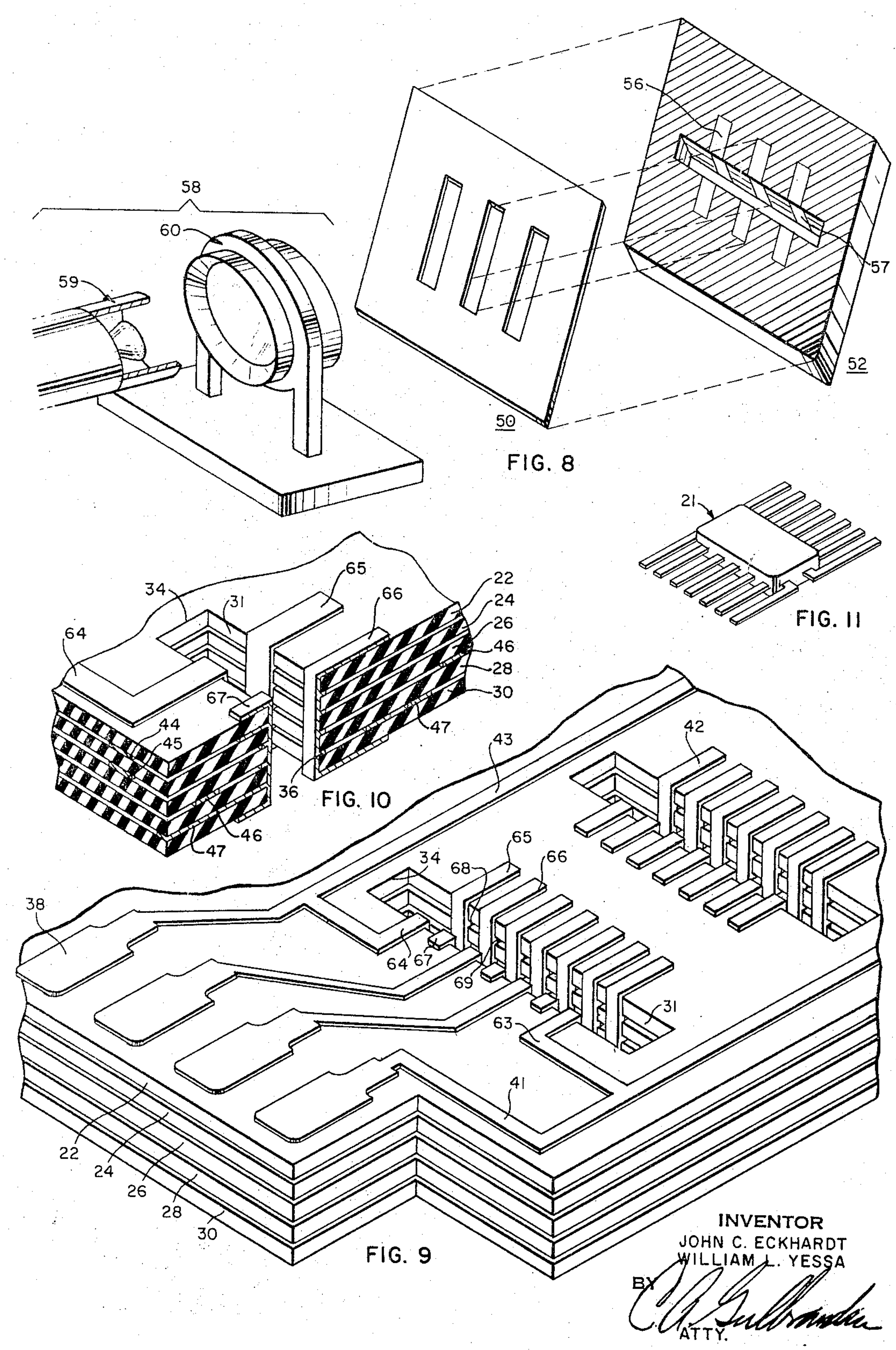
FIG. 8 shows a technique for passing a beam of light through a photographic negative to selectively expose the photosensitized surfaces of a multilayer board to light.
FIG. 9 shows an enlarged view of a portion of a finished multilayer board according to one embodiment of the invention.
FIG. 10 shows a sectional view of one of the slots in a completed multilayer board.
FIG. 11 shows a type of integrated circuit component which may be mounted on a multilayer board of the type shown in FIG. 1.

The board is then coated with photosensitive resist. It is important that the photo-resist coating on the slot walls and on the card surface be uniform. The normal tendency for resist to flow away from the slot edges can be corrected by adding a wetting agent to the resist itself which then permits application by dip or spray coating methods to properly coat the board with photo resist. Selected portions of the photosensitized surfaces are then exposed to light from a collimated light source 58, as shown in FIG. 8. A high-intensity xenon light source 59 having a high portion of light rays in the ultraviolet spectrum is used to permit a minimum photoresist exposure time. The light from this source 59 is collimated by a lens 60 which is placed between the source 60 and the artwork and board combination.

During the exposure, either positive or negative artworks may be used to obtain the desired selective exposure. However, it is preferable to use negative artworks.

A simplified drawing of the exposure process is shown in FIG. 8. A photographic mask 50 having the image of the desired surface-layer wiring pattern is positioned between the light source 58 and the photosensitized board 52 during exposure. In FIG. 8, it can be seen how the collimated light rays pass through the mask transferring alternating clear and opaque areas of the image to the photosensitized surfaces of the board 56 including the walls of the slot 57.

During the actual process, the photographic mask is held in intimate contact with the surface of the board. The collimated light source then serves to project sharply defined bands of light both on the surface of the board and on the walls of the slots in a pattern related to the conductive pattern to be formed on the board.

In order to provide an equal amount of light along the length of each conductor in each of the slots, two exposures are required lor each of the surfaces of the board preferably at an angle of approximately 45° to the surface of the board. This may be accomplished simultaneously with four collimated light sources, two on each side of the cards at the appropriate angles to the surface of the card, which is placed in a double-sided vacuum frame, or by moving one collimated light source to the four positions and making separate exposures. In the latter method, precise alignment must be maintained between the card 52, the photographic negative 50, and the angle of the light, to prevent widening of the conductors 57 in the slot.

The angle of the light may be used to determine how far the conductors are plated on the walls of the slot. For instance, if the board is exposed at an angle of 45°, the plated strips will extend through the slot, while, if the angle were 22½°, the strips would extend only about halfway down the slot wall.

After exposure, the surfaces are photograhpically developed and the card is ready for plating. The surfaces of the card are then electroplated with nickel to increase the strength of the conductors and the wear resistance of the contact tabs 38. This is followed by a gold electroplate to provide satisfactory electrical properties on the contacts and serve as an acid-resist during etching.

In order to establish the desired pattern of selective interconnections, portions of the copper must be etched from the surfaces of the slot and of the board. Those portions of the original copper plating which are to be removed have not been able to retain the acid-resistant gold plating because of the photoexposure process described above and hence, when the board is placed in an acid bath, the undesired portions of copper are etched away leaving the desired conductor pattern on the top and bottom surfaces of the board and a number of interconnecting strips on the walls of each slot.

As the density of the wiring is optimized, the etching of fine-line conductors becomes more critical, but rigid control of the electroplated thickness ratio and the photoresist exposure alignment will allow substantial reductions in the line widths.

An enlarged portion of completed board is shown in FIG. 9. As has been mentioned before, the conductor configuration is plated on the outer surfaces of insulating sheets 22 and 30 at the same time that the conductive strips 65, 66 and 67 are plated in the slots. In fact, as can be seen in FIG. 9, one of the input conductor tabs 38 is seen to be extended via conductors 43, along the top surface of the board to a junction point near the edge of the slot 31. At this point a portion of conductor 43 extends to the slot while another portion continues along the top edge. Conductor 43 does not end at the edge of the slot, but instead bends at a right angle to the surface of the board passing through the slot from one external surface of the board, to the other and coming out on the bottom surface of the board (not shown). For convenience, that portion of conductor 43 which passes through the slot is referenced as 64. In a similar manner, conductive strips 65, 66 and 67 are integral parts of the outer surface wiring, although they are shown to extend only a short distance from the edge of the slot.

In slot 31, conductive strip 65 is typical of the conductive strips that serve to interconnect the conductors on the internal layers of the board, such as at 68, while others of the conductors plated on the walls of the slot such as strip 66 serve only to connect the wiring on the upper layer with tabs 36, as shown at 69.

Some of the short conductors on the inner layers, such as the one at 69, are seen to extend only a short distance from the edge of the rectangular slot. Others of these short conductors, such as the one at 68, are seen to be integrally joined to the internal conductors, which in this case is the conductor 44 (FIG. 3) printed on the surface of the second layer 24, and to continue on internal to the board providing an electrical path to another wiring area within the board.

FIG. 10 shows a cross section of slot 31. In this view, it can be seen how conductors 64, 65, 66 and 67 have been selectively plated on the walls of the slot to interconnect certain of the conductors existing on certain of the inner layers 24, 26 and 28, and the conductors on the top and bottom surface layers 22 and 30. For instance, conductor 66 has a conductive portion plated on the wall of the slot to interconnect the tabs 36 on layers 24, 26, 28 and 30. In addition, this conductor 66 extends these points to the top and bottom surfaces of the board. In a similar fashion, conductor 67 is shown to interconnect conductor 47 on layer 30, and tabs 36 on layers 26 and 28. In the same manner, these points are also extended to the upper and lower surfaces of the board. The portions of conductors 64, 65, 66 and 67 which are located on the top and bottom surfaces of the board may be used as terminal points for the leads of components which are to be mounted on the board.

Conductor 47 on the top side of layer 30 is seen to extend perpendicular to conductor 46 on the top side of layer 28. Conductor 46 on the top side of layer 28 is seen to extend perpendicular to conductor 44 on the top side of layer 24. This demonstrates the fact that although numerous connections can be made via the slots, the conductors can still extend perpendicular to each other and be insulated from one another by the insulating material upon which the conductors are deposited. Also, as can be seen in FIG. 3, conductors 44 extend parallel or perpendicular to one another in an ordered fashion. This helps to increase the packaging density and wiring density of the board.

As shown in FIG. 10 conductive strips 64, 65, 66 and 67 extend from the top surface down through aperture 31 and to the bottom of the board. It is possible, as has been pointed out before, to have these conductors extend only partially down one wall of the slot. Hence, in the example shown, there could be fourteen conductors extending partially downward into the slot from the top of the board, and fourteen other conductors extending partially upward from the bottom of the board into the slot. Another variation would be to use the selective plating process to omit some of the conductive strips in various slots. In addition, the short edge of any of the slots such as edge 34 in slot 31 could also be used if further interconnections were required.

FIG. 11 shows an integrated circuit flat pack. A number of logical elements of this type may be interconnected using the multilayer printed board which has been described herein. The conductive strips 42 plated in each of the slots complement the lead configurations of the integrated circuits allowing maximum usage of the board surface area while reducing the total number of connections. The leads of the flat pack may be welded or soldered to the surface portions of conductive strips 42 to provide the desired connections as shown in FIG. 1.

Although this multiple conductor plated slot is compatible with integrated circuitry, it should not be assumed that this invention is limited only to the interconnection of integrated circuit type component means, for it is possible to connect discrete components such as transistors, diodes and passive elements to the external portions of the conductive strips 42.

In this particular example, only fourteen conductors have been plated on the walls of each slot, and only a few connections are shown in each of the views. However, the number of conductive strips that may be plated in each slot in the board is mainly limited by the fine line etching techniques.

Finally, the preferred embodiment described above has given mention only to rectangular slots. It should be evident that the apertures could be formed in the shape of a square, a circle, or any other configuration.

The invention has been described in detail in connection with a preferred embodiment, however, it is to be understood that this was done merely by way of example and not intended as a limitation to the spirit and scope of the invention as only defined by the following claims.

What is claimed is:

1. A multilayer circuit board comprising: a plurality of insulating sheets having a predetermined pattern of conductors printed thereon bonded together to form a composite board having printed conductors on several layers thereof (each of said sheets having a predetermined pattern of conductors printed thereon; a plurality of substantially rectangular slots), at least one aperture in said board extending from one to the other external surface thereof, certain of said conductors extending to and exposed at the walls of said aperture; and a plurality of strips of conducting material on the walls of said aperture and extending from said one to said other external surface of the board, electrically and selectively interconnecting the conductors existing on the several layers of the composite board.

2. A multilayer circuit board comprising: a plurality of insulating sheets having a predetermined pattern of conductors printed thereon bonded together to form a composite board having printed conductors on several layers thereof; at least one aperture in said board, said aperture having walls extending perpendicularly to said board throughout the thickness thereof, certain of said conductors extending to and exposed at the walls of said aperture; and a plurality of thin strips of conducting material extending along at least one of said perpendicular walls of said aperture, each said strip interconnnecting the conductors existing on the several layers of the composite board.

3. A multilayer circuit board as claimed in claim 1, wherein certain of said strips of conducting material interconnect conductors existing on nonadjacent layers of the board.

4. A multilayer circuit board as claimed in claim 1, wherein said apertures are substantially rectangular slots and wherein there are a plurality of said stips on each of two opposing walls of each said slot.

References Cited

UNITED STATES PATENTS

| | | | |
|---|---|---|---|
| 3,052,823 | 9/1962 | Anderson et al. ---- | 174—68.5 X |
| 3,102,213 | 8/1963 | Bedson et al. ------ | 317—101 X |

OTHER REFERENCES

Guditz, "Three-Dimensional Printed Wiring," published in Electronics, June 1957, pp. 160–163.

DARRELL L. CLAY, *Primary Examiner.*

UNITED STATES PATENT OFFICE

CERTIFICATE OF CORRECTION

Patent No. 3,349,162 October 24, 1967

John C. Eckhardt et al.

It is hereby certified that error appears in the above numbered patent requiring correction and that the said Letters Patent should read as corrected below.

Column 6, lines 55 to 57, strike out "(each of said sheets having a predetermined pattern of conductors printed thereon; a plurality of substantially rectangular slots)".

Signed and sealed this 19th day of November 1968.

(SEAL)
Attest:

Edward M. Fletcher, Jr.
Attesting Officer

EDWARD J. BRENNER
Commissioner of Patents